United States Patent
Lee

(10) Patent No.: US 10,802,625 B2
(45) Date of Patent: Oct. 13, 2020

(54) DISPLAY DEVICE HAVING TOUCH SENSOR AND BLACK MATRIX ON THE ENCAPSULATION UNIT

(71) Applicant: LG DISPLAY CO., LTD., Seoul (KR)

(72) Inventor: Eun-Hye Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 12 days.

(21) Appl. No.: 16/035,176

(22) Filed: Jul. 13, 2018

(65) Prior Publication Data
US 2019/0018530 A1 Jan. 17, 2019

(30) Foreign Application Priority Data
Jul. 14, 2017 (KR) .................. 10-2017-0089758

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *H01L 27/322* (2013.01);
(Continued)

(58) Field of Classification Search
CPC .... G06F 3/0412; G06F 3/04164; G06F 3/044; G06F 2203/04111; G06F 2203/04112; G09G 3/30; G09G 3/32; G09G 3/3208; G09G 3/3225; G09G 3/3258; H01L 23/28; H01L 23/31; H01L 27/1214; H01L 27/32; H01L 27/3211; H01L 27/3218; H01L 27/322; H01L 27/323; H01L 27/3244; H01L 27/3246; H01L 27/326; H01L 27/3258; H01L 27/3272; H01L 27/3276; H01L 27/3295; H01L 51/5237; H01L 51/5253; H01L 51/5281; H01L 51/5284

See application file for complete search history.

(56) References Cited

U.S. PATENT DOCUMENTS

| 2011/0096017 A1* | 4/2011 | Li | ........................ G06F 3/044 |
| | | | 345/174 |
| 2011/0242444 A1* | 10/2011 | Song | .................... G06F 3/0412 |
| | | | 349/43 |

(Continued)

*Primary Examiner* — Keith L Crawley
(74) *Attorney, Agent, or Firm* — Birch, Stewart, Kolasch & Birch, LLP

(57) ABSTRACT

A display device having touch sensors is discussed, which can achieve process simplification and cost reduction. In the display device, a black matrix including first and second black layers is arranged on an encapsulation unit arranged to cover light emitting elements, the first black layer is conductively connected to a plurality of touch electrodes and is arranged between color filters overlapping the touch electrodes, and the second black layer is arranged on a different plane from the first black layer and is arranged between color filters not overlapping the touch electrodes. Thereby, the first black layer can be used not only as the black matrix but also as the touch electrodes and thus light leakage can be prevented and an aperture ratio can be improved, and the touch sensors are arranged on the encapsulation unit without a separate attachment process and thus process simplification and cost reduction can be achieved.

17 Claims, 12 Drawing Sheets

(51) Int. Cl.
*H01L 27/32* (2006.01)
*H01L 51/52* (2006.01)
(52) U.S. Cl.
CPC ........ *H01L 27/323* (2013.01); *H01L 27/3244* (2013.01); *H01L 51/5253* (2013.01); *H01L 51/5256* (2013.01); *H01L 51/5284* (2013.01); *G06F 2203/04103* (2013.01); *G06F 2203/04111* (2013.01)

(56) References Cited

U.S. PATENT DOCUMENTS

| | | | |
|---|---|---|---|
| 2014/0353691 A1* | 12/2014 | Lee | H01L 27/323 257/88 |
| 2014/0375911 A1* | 12/2014 | Lee | G02F 1/13338 349/12 |
| 2015/0049030 A1* | 2/2015 | Her | G06F 3/0412 345/173 |
| 2017/0038871 A1* | 2/2017 | Zhou | G02F 1/13338 |
| 2017/0090634 A1* | 3/2017 | Yang | G06F 3/0412 |
| 2017/0278899 A1* | 9/2017 | Yang | H01L 51/0097 |
| 2018/0308902 A1* | 10/2018 | Lee | H01L 27/323 |

* cited by examiner $W_1 > W_2$

DISPLAY DEVICE HAVING TOUCH SENSOR AND BLACK MATRIX ON THE ENCAPSULATION UNIT This application claims the priority benefit of Korean Patent Application No. 10-2017-0089758, filed on Jul. 14, 2017 in the Republic of Korea, which is hereby incorporated by reference as if fully set forth herein.

BACKGROUND OF THE INVENTION

Field of the Invention

The present invention relates to a display device having touch sensors, and more particularly, to a display device having touch sensors which can achieve process simplification and cost reduction.

Discussion of the Related Art

A touchscreen is an input device through which a user command can be input by selecting instructions displayed on a screen of a display device using a human hand or an article. That is, the touchscreen converts a contact position directly contacted by a human hand or an article into an electrical signal, and receives instructions selected at the contact position as an input signal. Such a touchscreen can substitute for a separate input device which is connected to the display device and thus can be operated, such as a keyboard or a mouse. As a result, the range of use of the touchscreen is gradually extended.

In general, a touchscreen is attached to a front surface of a display panel, such as a liquid crystal display panel or an organic electroluminescent diode display panel, through an adhesive. In this case, since the touchscreen is separately manufactured and then attached to the front surface of the display panel, an attachment process is added and, thus, the overall process is complicated and manufacturing costs are raised.

SUMMARY OF THE INVENTION

Accordingly, the present invention is directed to a display device having touch sensors that substantially obviates one or more problems due to limitations and disadvantages of the related art.

An object of the present invention is to provide a display device having touch sensors which can achieve process simplification and cost reduction.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display device having touch sensors includes a black matrix including first and second black layers and arranged on an encapsulation unit arranged to cover light emitting elements, the first black layer is conductively connected to a plurality of touch electrodes and is arranged between color filters overlapping the touch electrodes, and the second black layer is arranged on a different plane from the first black layer and is arranged between color filters not overlapping the touch electrodes. As a result, the first black layer is used not only as the black matrix but also as the touch electrodes and thus light leakage is prevented and an aperture ratio is improved, and the touch sensors are arranged on the encapsulation unit without a separate attachment process and thus process simplification and cost reduction are achieved.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Reference will now be made in detail to the preferred embodiments of the present invention, examples of which are illustrated in the accompanying drawings. Below, a term 'film' can be interchangeably used with other related terms such as a 'layer'.

Figure 1:
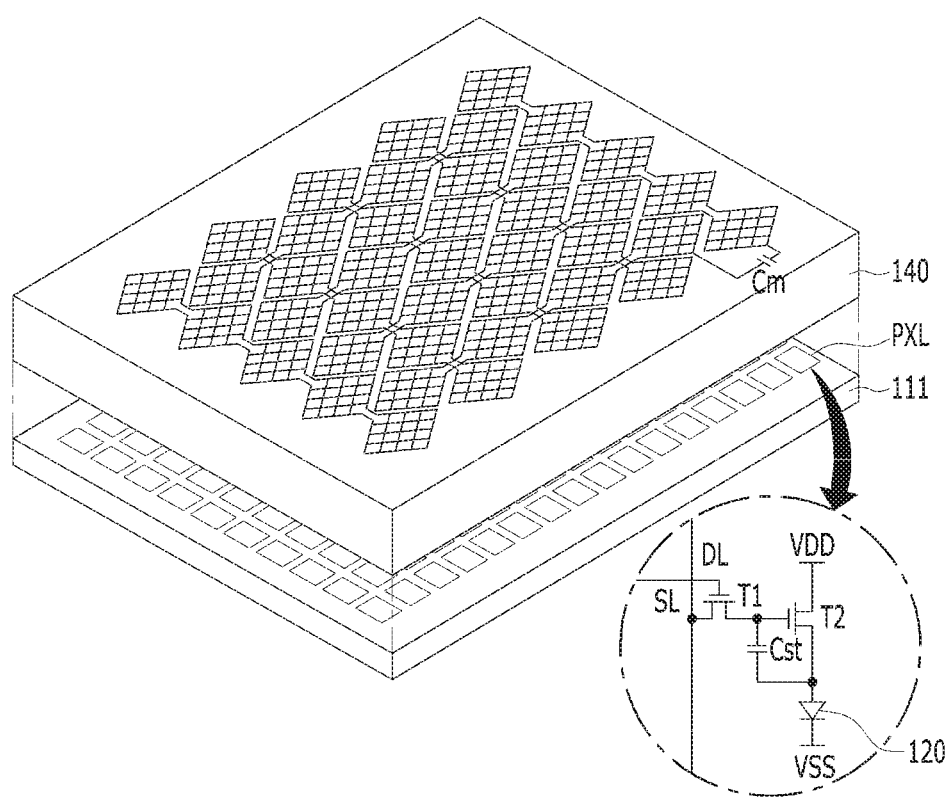
FIG. 1 is a perspective view illustrating an organic light emitting display device having touch sensors in accordance with one embodiment of the present invention.

FIG. 1 is a perspective view illustrating an organic light emitting display device having touch sensors in accordance with one embodiment of the present invention. All the components of the organic light emitting display device according to all embodiments of the present invention are operatively coupled and configured.

Figure 2:
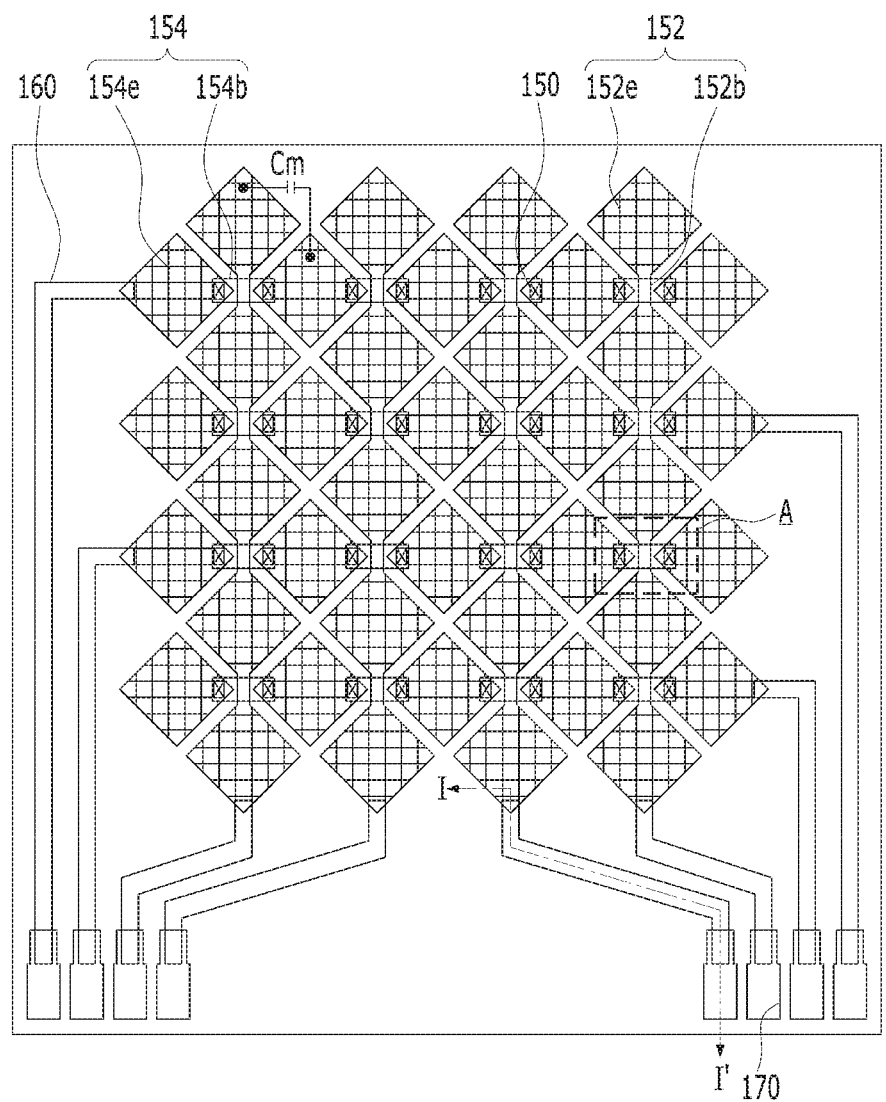
FIG. 2 is a plan view illustrating the organic light emitting display device shown in FIG. 1.

Referring to FIG. 1, the organic light emitting display device displays an image through a plurality of sub-pixels PXL including light emitting elements 120 and senses whether or not a user touch has occurred and a touch position by sensing a change in the mutual capacitances Cm (touch sensors) due to the user touch through touch electrodes 152e and 154e shown in FIG. 2.

For this purpose, the organic light emitting display shown in FIG. 1 includes a plurality of the sub-pixels PXL arranged in a matrix on a substrate 111, an encapsulation unit 140 arranged on the sub-pixels PXL, and the mutual capacitances Cm arranged on the encapsulation unit 140.

Each of the sub-pixels PXL includes a pixel driving circuit and the light emitting element 120 connected to the pixel driving circuit.

Each of the pixel driving circuits includes a switching transistor T1, a driving transistor T2 and a storage capacitor Cst.

When a scan pulse is supplied to a scan line SL, the switching transistor T1 is turned on and thus supplies a data signal, supplied to a data line DL, to the storage capacitor Cst and a gate electrode of the driving transistor T2.

The driving transistor T2 controls current I supplied from a high voltage (VDD) supply line to the light emitting element 120 in response to the data signal supplied to the gate electrode of the driving transistor T2, thus adjusting the amount of light emitted from the light emitting element 120. Further, even if the switching transistor T1 is turned off, the driving transistor T2 supplies regular current by voltage charging the storage capacitor Cst until a data signal of a next frame is supplied and, thus, the light emitting element 120 maintains light emission.

Figure 3:
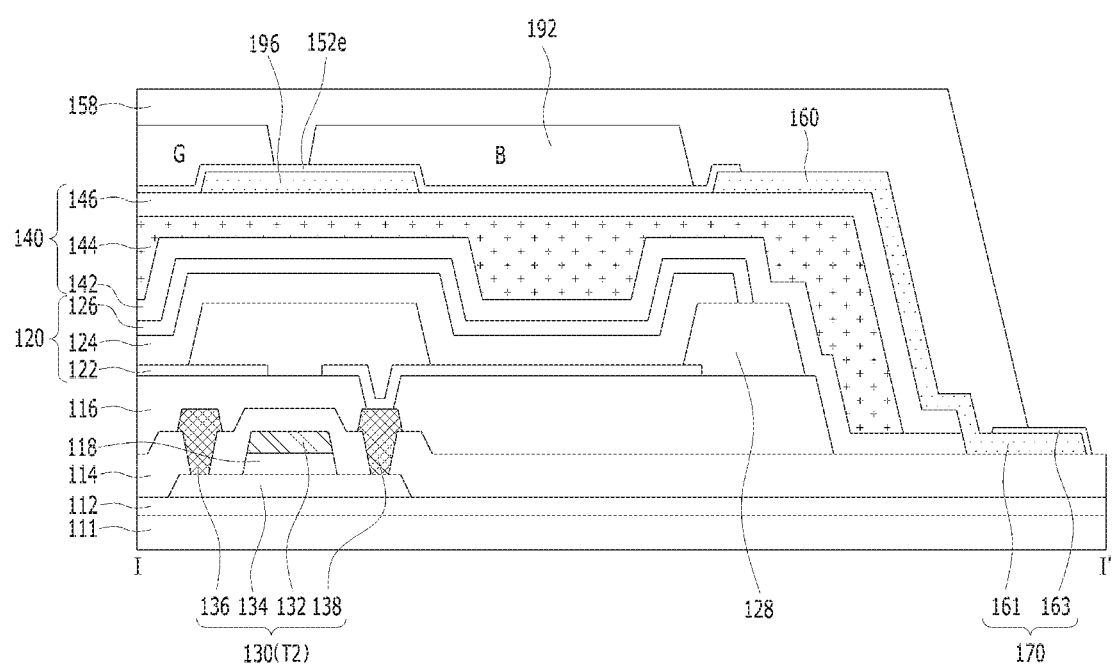
FIG. 3 is a cross-sectional view of the organic light emitting display device shown in FIG. 2, taken along line I-I'.

Such a driving transistor T2 (denoted by 130 in FIG. 3) includes, as exemplarily shown in FIG. 3, a gate electrode 132, an active layer 134, and source and drain electrodes 136 and 138. The gate electrode 132 overlaps the active layer 134 with a gate insulating film 118 disposed therebetween. The source and drain electrodes 136 and 138 are formed on an interlayer insulating film 114 and contact the active layer 134. The active layer 134 is formed of at least one of an amorphous semiconductor material, a polycrystalline semiconductor material or an oxide semiconductor material, on a buffer layer 112. Here, the buffer layer 112 is arranged between the active layer 134 and the substrate 111 and prevents impurities from the substrate 111 from being introduced into the active layer 134. The interlayer insulating film 114 is disposed between the source and drain electrodes 136 and 138 and the gate electrode 132 and thus electrically insulates the source and drain electrodes 136 and 138 and the gate electrode 132 from each other.

The light emitting element 120 includes an anode 122, at least one light emitting stack 124 formed on the anode 122, and a cathode 126 formed on the at least one light emitting stack 124.

The anode 122 is conductively connected to the drain electrode 138 of the driving transistor 130 (T2) exposed through a pixel contact hole formed through a protective film 116. Here, the protective film 116 is formed of an inorganic insulating material and/or an organic insulating between the source and drain electrodes 136 and 138 and the light emitting element 120.

The at least one light emitting stack 124 is formed on the anode 122 in an emission area prepared by a bank 128. The at least one light emitting stack 124 is formed by stacking a hole-related layer, an organic light emitting layer and an electron-related layer on the anode 122 in regular order or in reverse order. Further, the at least one light emitting stack 124 can include first and second light emitting stacks disposed opposite to each other with a charge generation layer CGL disposed therebetween. In this case, an organic light emitting layer of one of the first and second light emitting stacks generates blue light and an organic light emitting layer of the other of the first and second light emitting stacks generates yellow-green light and, thus, white light is generated through the first and second light emitting stacks. White light generated by the at least one light emitting stack 124 is incident upon color filters located on or under the at least one light emitting stack 124, thus implementing a color image. Otherwise, without separate color filters, each light emitting stack 124 can generate color light corresponding to each sub-pixel, thus implementing a color image. That is, the light emitting stack 124 of a red (R) sub-pixel can generate red light, the light emitting stack 124 of a green (G) sub-pixel can generate green light, and the light emitting stack 124 of a blue (B) sub-pixel can generate blue light.

The cathode 126 is formed opposite to the anode 122 with the at least one light emitting stack 124 disposed therebetween and is connected to a low voltage (VSS) supply line.

The encapsulation unit 140 prevents external moisture or oxygen (or any other undesirable substances) from penetrating into the light emitting elements 120, which are vulnerable to external moisture or oxygen. For this purpose, the encapsulation unit 140 includes a plurality of inorganic encapsulation layers 142 and 146 and an organic encapsulation layer 144 arranged between the inorganic encapsulation layers 142 and 146, and the inorganic encapsulation layer 146 is arranged as the uppermost layer. Here, the encapsulation unit 140 includes at least two inorganic encapsulation layers 142 and 146 and at least one organic encapsulation layer 144. In the present embodiment of the present invention, the structure of the encapsulation unit 140, in which the organic encapsulation layer 144 is arranged between the first and second inorganic encapsulation layers 142 and 146, will be described only as an example and other examples are part of the present invention.

The first inorganic encapsulation layer 142 is formed on the substrate 111 provided with the cathode 126 formed thereon so as to be located adjacent to the light emitting element 120. Such a first inorganic encapsulation layer 142 is formed of an inorganic insulating material which can be deposited at a low temperature, such as silicon nitride ($SiN_x$), silicon oxide ($SiO_x$), silicon oxynitride (SiON) or aluminum oxide ($Al_2O_3$). Since the first inorganic encapsulation layer 142 is deposited in a low-temperature atmosphere, damage to the light emitting stack 124, which is vulnerable to a high-temperature atmosphere, during a deposition process of the first inorganic encapsulation layer 142, can be prevented.

The organic encapsulation layer 144 serves as a buffer to reduce stress between respective layers according to bending of the organic light emitting display device and strengthens planarization performance of the organic light emitting display device. The organic encapsulation layer 144 is formed of an organic insulating material, such as acrylic resin, epoxy resin, polyimide, polyethylene or silicon oxycarbide (SiOC).

The second inorganic encapsulation layer 146 is formed to cover the upper and side surfaces of the organic encapsulation layer 144 and the upper surface of the first inorganic encapsulation layer 142 exposed by the organic encapsulation layer 144. Thereby, the second inorganic encapsulation layer 146 minimizes and prevents penetration of external moisture or oxygen into the first inorganic encapsulation layer 142 and the organic encapsulation layer 144. The second inorganic encapsulation layer 146 is formed of an inorganic insulating material, such as silicon nitride ($SiN_x$), silicon oxide ($SiO_x$), silicon oxynitride (SiON) or aluminum oxide ($Al_2O_3$).

Touch sensing lines 154 and touch driving lines 152 are arranged on the encapsulation unit 140 so as to intersect each other with color filters 152 and a touch insulating film 158 disposed therebetween. The mutual capacitances Cm are formed at the intersections between the touch sensing lines 154 and the touch driving lines 152. Therefore, the mutual capacitance Cm is charged with charges by a touch driving pulse supplied to the touch driving line 152 and discharges the charges to the touch sensing line 154, thus serving as a touch sensor.

The touch driving line 152 includes a plurality of first touch electrodes 152e and first bridges 152b to conductively connect the first touch electrodes 152e.

The first touch electrodes 152e are spaced apart from each other at regular intervals in a first direction, e.g., the Y-axis direction, on the second inorganic encapsulation layer 146. Each of the first touch electrodes 152e is conductively connected to the adjacent first touch electrode 152e through the first bridge 152b.

The first bridges 152b are arranged on the second inorganic encapsulation layer 146 so as to be coplanar with the first touch electrodes 152e, and are conductively connected to the first touch electrodes 152e without separate contact holes.

The touch sensing line 154 includes a plurality of second touch electrodes 154e and second bridges 154b to conductively connect the second touch electrodes 154e.

The second touch electrodes 154e are spaced apart from each other at regular intervals in a second direction, e.g., in the X-axis direction, on the second inorganic encapsulation layer 146. Each of the second touch electrodes 154e is conductively connected to the adjacent second touch electrode 154e through the second bridge 154b.

The first touch electrodes 152e, the first bridges 152b and the second touch electrodes 154e are formed of a transparent conductive layer, such as indium tin oxide (ITO) or indium zinc oxide (IZO).

Figure 4:
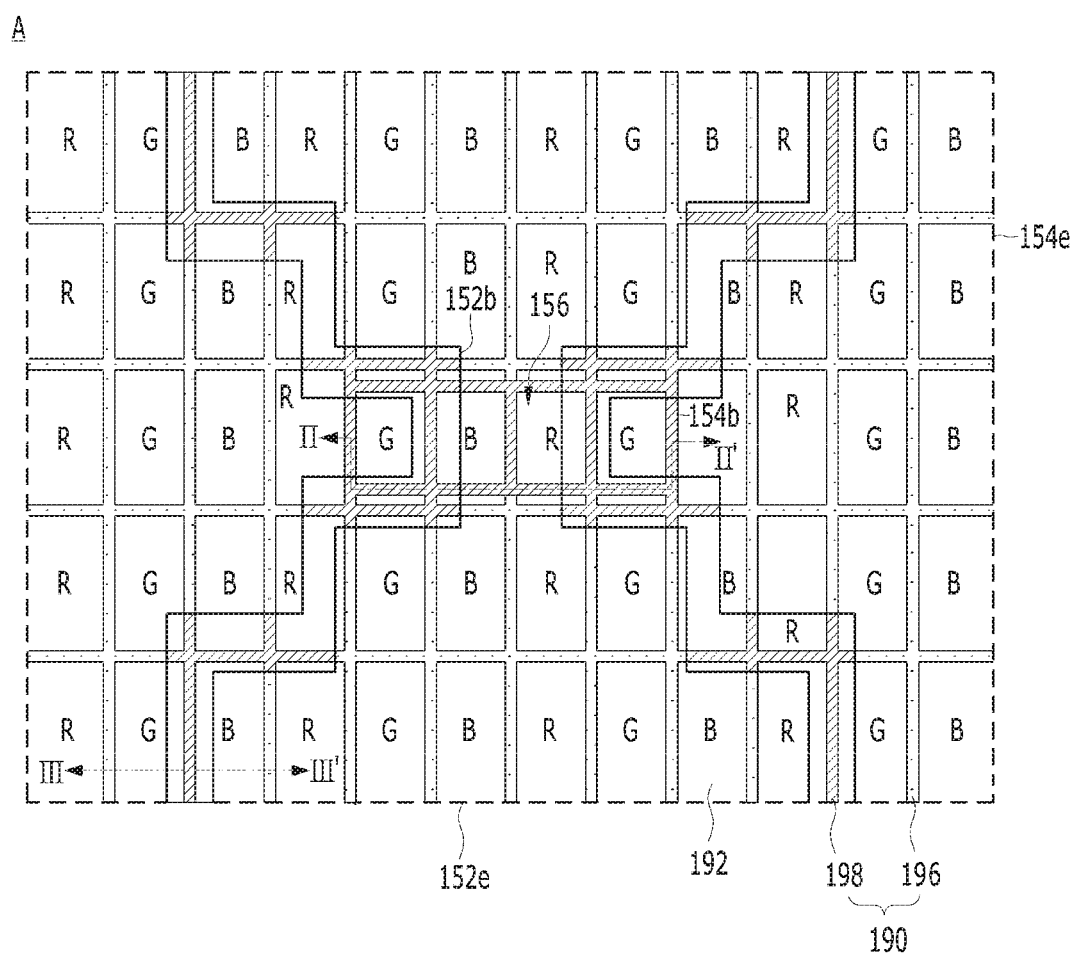
FIG. 4 is an enlarged plan view of a region A shown in FIG. 2.
Figure 5:
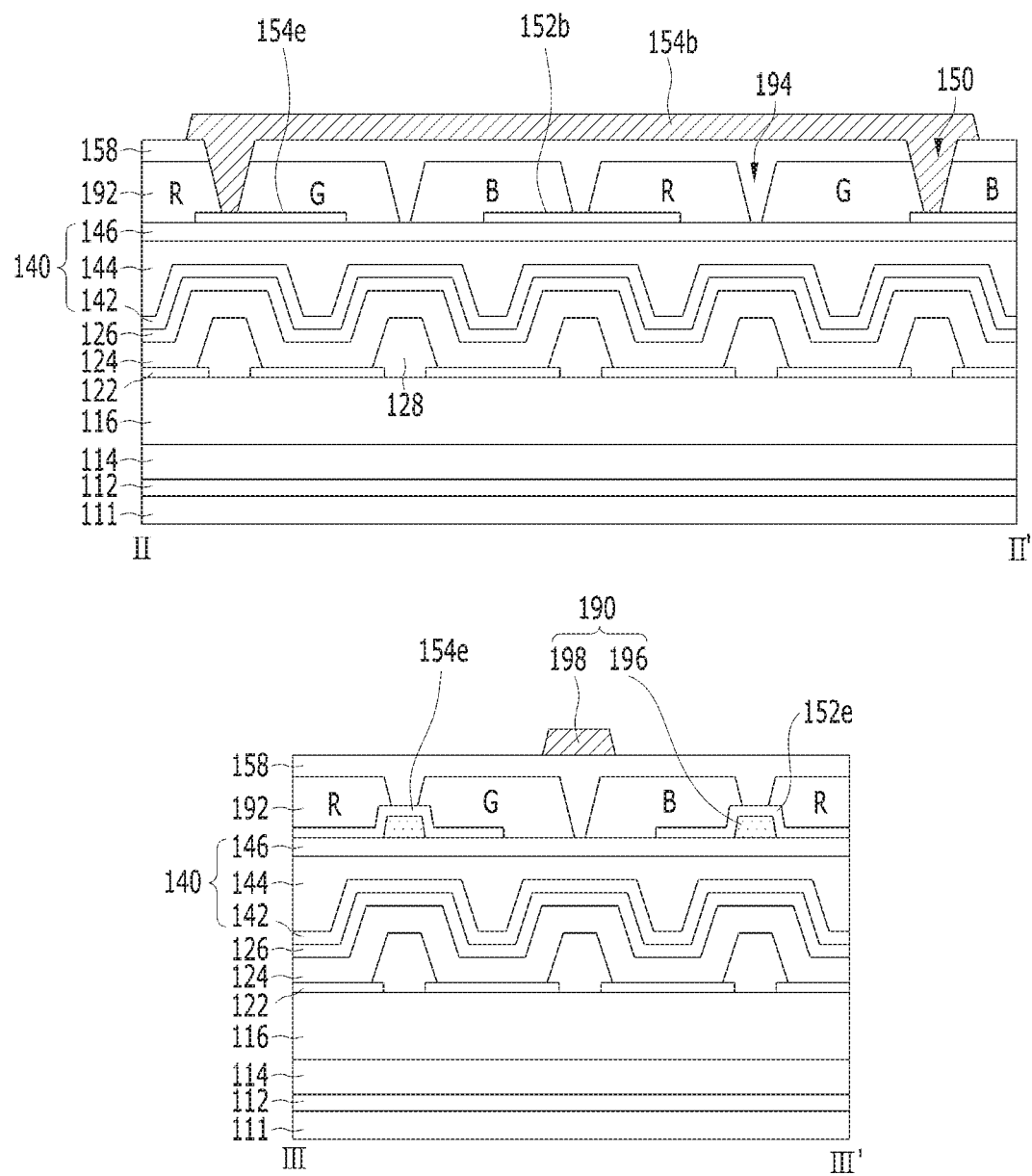
FIG. 5 illustrates cross-sectional views of the light emitting display device of FIG. 4, taken along lines II-II' and III-III'.

The second bridges 154b are formed on the touch insulating film 158 and are conductively connected to the second touch electrodes 154e exposed through color holes 194 formed through the color filters 192 and touch contact holes 150 formed through the touch insulating film 158, as exemplarily shown in FIGS. 4 and 5. In the same or similar manner as the first bridges 152b, the second bridges 154b are arranged so as to overlap the bank 128 and, thus, lowering of an aperture ratio due to the first and second bridges 152b and 154b can be prevented.

The second bridge 154b includes a plurality of slits 156 which expose emission areas of the respective sub-pixels, as exemplarily shown in FIG. 4. The total area of the second bridge 154b is decreased by an area of the second bridge 154b which is occupied by the slits 156. Thereby, reflection of external light by the second bridges 154b can be reduced and, thus, lowering of visibility can be prevented.

The touch driving lines 152 and the touch sensing lines 154 including the touch electrodes 152e and 154e and the bridges 152b and 154b are connected to a touch driving unit through routing lines 160 and touch pads 170 arranged in a non-active (bezel) area, as exemplarily shown in FIG. 2.

The routing lines 160 transmit a touch driving pulse generated by the touch driving unit to the tough driving lines 152 through the touch pads 170 and transmit a touch signal from the touch sensing lines 154 to the touch pads 170.

For this purpose, the routing lines 160 are arranged between the first and second touch electrodes 152e and 154e and the touch pads 170 so as to be connected to the first and second touch electrodes 152e and 154e and the touch pads 170. The routing lines 160 connected to the first touch electrodes 152e are extended towards at least one of upper or lower sides of the active area and are connected to the touch pads 170, as exemplarily shown in FIG. 2. The routing lines 160 connected to the second touch electrodes 154e are extended towards at least one of left and right sides of the active area and are connected to the touch pads 170. Arrangement of the routing lines 160 is not limited to the structure of FIG. 2 and can be variously changed according to design specifications of the display device.

The routing lines 160 are formed of the same material as a first black layer 196 and contacts the side surfaces of the encapsulation unit 140 so as to cover the side surfaces of the encapsulation unit 140, as exemplarily shown in FIG. 3.

The routing lines 160 can be formed to have a monolayer or multilayer structure using the same material as the first black layer 196. If the routing lines 160 are formed to have a multilayer structure using the same materials as at least two of the first black layer 196, the first bridges 152b or the second bridges 154b, resistance of the routing lines 160 can be reduced. Further, even if disconnection of one layer of the routing lines 160 having the multilayer structure occurs, a touch driving pulse and a touch signal can be transmitted through the remaining layers of the routing lines 160 and, thus, reliability can be improved.

The touch pads 170 are formed to be exposed to the outside and are thus connected to a signal transmission film on which the touch driving unit is mounted. The touch pads 170, together with display pads connected to at least one of the data line, the gate line, the low voltage supply line and the high voltage supply line, can be arranged in at least one of one side region or the other side region of the substrate 111, or the touch pads 170 and the display pads can be arranged in different regions of the non-active area.

The touch pads 170 are arranged on at least one insulating film selected from the group consisting of the buffer layer 112, the interlayer insulating film 114 and the protective film 116, which are arranged between the substrate 111 and the encapsulation unit 140, and contact the at least one insulating film. For example, the touch pads 170 and the display pads can be arranged on the interlayer insulating film 114.

Each of the touch pads 170 includes a first pad electrode 161 and a second pad electrode 163 arranged on the first pad electrode 161.

The first pad electrode 161 extends from the routing line 160 toward a pad area and is conductively connected to the routing line 160. The first pad electrode 161 is formed through the same mask process as the routing lines 160 using the same material as the routing lines 160.

The second pad electrode 163 is formed to cover the upper and side surfaces of the first pad electrode 161 and is conductively connected to the first pad electrode 161. The second pad electrode 163 is exposed to the outside by the touch insulating film 158 and is thus formed of a transparent conductive layer having high acid resistance and corrosion resistance. Therefore, the second electrode pad 163 is formed through the same mask process as the first and second touch electrodes 152e and 154e using the same material as the first and second touch electrodes 152e and 154e.

As such, each of the first and second touch electrodes 152e and 154e and the first and second bridges 152b and 154b of the organic light emitting display device in accordance with the present invention is formed to have a size corresponding to the overall size of a plurality of sub-pixel regions in consideration of a user touch area, as exemplarily shown in FIG. 4.

Therefore, each of the first and second touch electrodes 152e and 154e and the first and second bridges 152b and 154b overlaps a plurality of color filters 192 and a plurality of rows and columns of a black matrix 190, as exemplarily shown in FIGS. 4 and 5.

The black matrix 190 is arranged in a region corresponding to the bank 128. Such a black matrix 190 includes first and second black layers 196 and 198, which are arranged on different planes and formed as a mesh type.

The first black layer 196 is arranged between the color filters 192 which overlap the first and second touch electrodes 152e and 154e. That is, the first black layer 196 serves to divide a plurality of sub-pixel regions, which overlap the first and second electrodes 152e and 154e, from each other and to prevent optical coherence and light leakage between the sub-pixel regions, which overlap the first and second electrodes 152e and 154e.

The first black layer 196 is formed of the same material as the routing lines 160 on the same plane as the routing lines 160 (i.e., on the encapsulation unit 140). For example, the first black layer 196 can be formed of an opaque conductive layer having excellent conductivity, such as Al, Ti, Cu or Mo. For example, the first black layer 196 and the routing lines 160 can have a three-layer structure, such as Ti/Al/Ti or Mo/Al/Mo.

The first black layer 196 is arranged on or under the first and second touch electrodes 152e and 154e and the first bridges 152b and is conductively connected to the first and second touch electrodes 152e and 154e and the first bridges 152b. Therefore, resistance and capacitance of the first and second touch electrodes 152e and 154e and the first bridges 152b formed of a transparent conductive layer are reduced by the first black layer 196 and, thus, an RC time constant can be lowered and touch sensitivity can be improved.

The second black layer 198 is arranged between the color filters 192 which are exposed from spaces between the touch driving lines 152 and the touch sensing lines 154. That is, the second black layer 198 is arranged between the color filters 192, which do not overlap the first and second touch electrodes 152e and 154e. Therefore, the second black layer 198 serves to divide a plurality of sub-pixel regions, which do not overlap the first and second electrodes 152e and 154e, from each other and to prevent optical coherence and light leakage between the sub-pixel regions, which do not overlap the first and second electrodes 152e and 154e.

The second black layer 198 is formed of the same material as the second bridges 154b on the same plane as the second bridges 154b (i.e., on the touch insulating film 158). For example, the second black layer 198 can be formed of an opaque conductive layer having excellent conductivity, such as Al, Ti, Cu or Mo. For example, the second black layer 198 and the second bridges 154b can have a three-layer structure, such as Ti/Al/Ti or Mo/Al/Mo.

The second black layer 198 is formed as an island type between a region of the first black layer 196 connected to the first touch electrode 152e and a region of the first black layer 196 connected to the second touch electrode 154e and, thus, is not conductively connected to the first black layer 196 and the first and second touch electrodes 152e and 154e. Therefore, electrical short circuit between the first touch electrode 152e of the touch driving line 152 and the second touch electrode 154e of the touch sensing line 154 by the second black matrix 198 can be prevented.

The color filters 192 are arranged on the substrate 111 provided with the first and second touch electrodes 152e and 154e formed thereon. The color filters 192 implement colors corresponding to the respective sub-pixel regions. For this purpose, the red (R) color filter 192 is formed on the red sub-pixel region, the green (G) color filter 192 is formed on the green sub-pixel region, and the blue (B) color filter 192 is formed on the blue sub-pixel region.

Figure 6A:
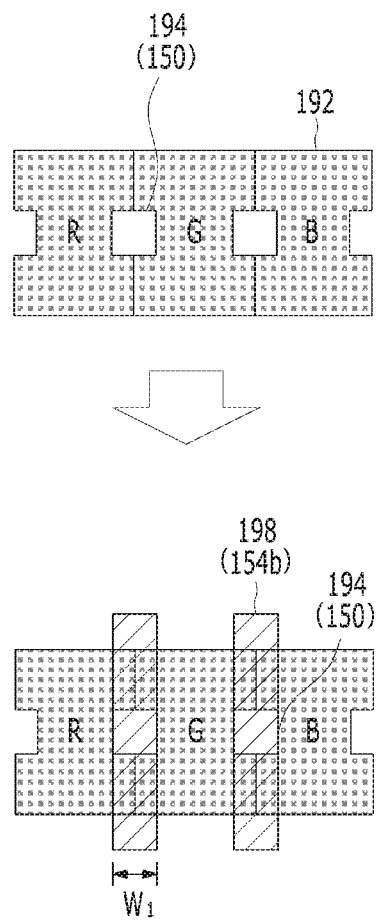
FIGS. 6A and 6B are plan views illustrating various examples of color filters shown in FIG. 5.
Figure 6B:
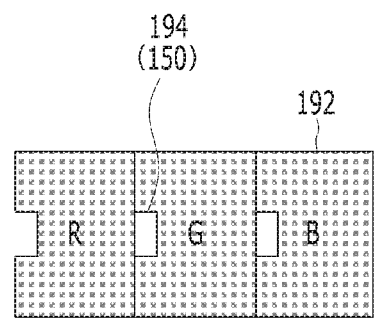
Figure 6B:
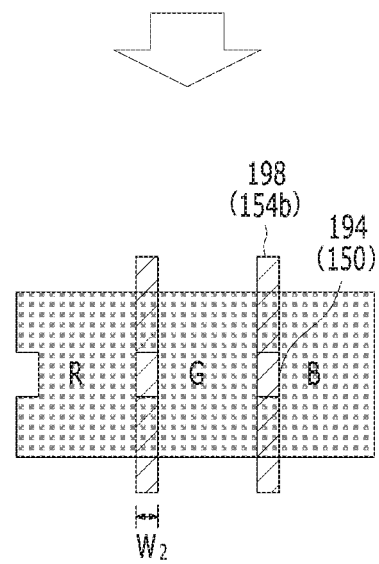

The color filters 192 are formed to have a recessed central part, as exemplarily shown in FIGS. 6A and 6B.

As an example, each of color filters 192 shown in FIG. 6A is formed to have one polygonal shape, selected from the group consisting of an octagonal shape to a dodecagonal shape, with recessed portions having a C-shape, an inequality sign-shape (<) or a square bracket-shape ([) formed at both side surfaces thereof. The recessed portions formed at both sides of the color filters 192 can have the same shape or different shapes. In this case, the recessed portions of the neighboring color filters 192 implementing different colors contact each other and, thus, a color hole 194 having a first line width w1 is formed between the neighboring color filters 192 implementing different colors. Therefore, the second bridges 154e connected to the second touch electrodes 154e, exposed through the color holes 194 and the touch contact holes 150, and the second black layer 198 overlapping the color holes 194 have the first line width w1 so as to overlap both side surfaces of each of the color filters 192.

In another example, each of color filters 192 shown in FIG. 6B is formed to have one polygonal shape, selected from the group consisting of a hexagonal shape to an octagonal shape, with a recessed portion having a C-shape, an inequality sign-shape (<) or a square bracket-shape ([) formed at one side surface thereof. In this example, the recessed portion of the color filter 192 and the other side surface of the neighboring color filter 192 contact each other and, thus, a color hole 194 having a second line width w2, which is smaller than the first line width w1, is formed between the neighboring color filters 192 implementing different colors. The second bridges 154e connected to the second touch electrodes 154e, exposed through the color holes 194 and the touch contact holes 150, and the second black layer 198 overlapping the color holes 194 have the second line width w2, which is smaller than the first line width w1, so as to overlap one side surface of each of the color filters 192. Thereby, the structure of FIG. 6B has a fine line width of the second bridges 154b and the second black layer 198, as compared to the structure of FIG. 6A, and, thus, an aperture ratio can be improved.

As such, in the embodiments of the present invention, the recessed portion is formed at at least one side surface of each of the color filters 192 and the recessed portions of the neighboring color filters 192 implementing different colors contact each other, thus forming the color hole 194 between the neighboring color filters 192 implementing different colors. The second bridges 154e connected to the second touch electrodes 154e, exposed through the color holes 194 and the touch contact holes 150, and the second black layer 198 arranged on the color holes 194 can have the same line width as the color holes 194 at most. Therefore, the second black layer 198 and the second bridges 154b of the present invention can have a line width of at least 4 μm and, thus, an aperture ratio can be improved. Further, in the embodiments of the present invention, the black matrix 190 including the first and second black layers 196 and 98 is arranged, the first black layer 196 is conductively connected to the touch electrodes 152e and 154e and is arranged between the color filters 192, which overlap the touch electrodes 152e and 154e, and the second black layer 198 is disposed on a different plane from the first black layer 196 and is arranged between the color filters 192, which do not overlap the touch electrodes 152e and 154e. Thereby, in the embodiments of the present invention, the first black layer 196 can be used not only as the black matrix 190 but also as the touch electrodes 152*e* and 154*e* and, thus, light leakage can be prevented and an aperture ratio can be improved.

FIGS. 7A to 7E are cross-sectional views illustrating a method of manufacturing the organic light emitting display device shown in FIG. 5 according to an embodiment of the present invention. The method of manufacturing the organic light emitting display device in accordance with the present invention will be described with reference to FIGS. 3 and 5.

First, an opaque conductive layer is deposited on the whole surface of the substrate 111 provided with the switching transistors T1, the driving transistors 130 (T2), the light emitting elements 120 and the encapsulation unit 140 formed thereon through a deposition process. Thereafter, the opaque conductive layer is patterned through a photolithography process and an etching process, thus forming the first black layer 196, the routing lines 160 and the first pad electrodes 161, as exemplarily shown in FIG. 7A.

Thereafter, a transparent conductive layer is deposited on the whole surface of the substrate 111 provided with the first black layer 196, the routing lines 160 and the first pad electrodes 161 formed thereon. Thereafter, the transparent conductive layer is patterned by a photolithography process and an etching process, thus forming the first and second touch electrodes 152*e* and 154*e*, the first bridges 152*b* and the second pad electrodes 163, as exemplarily shown in FIG. 7B.

Figure 7A:
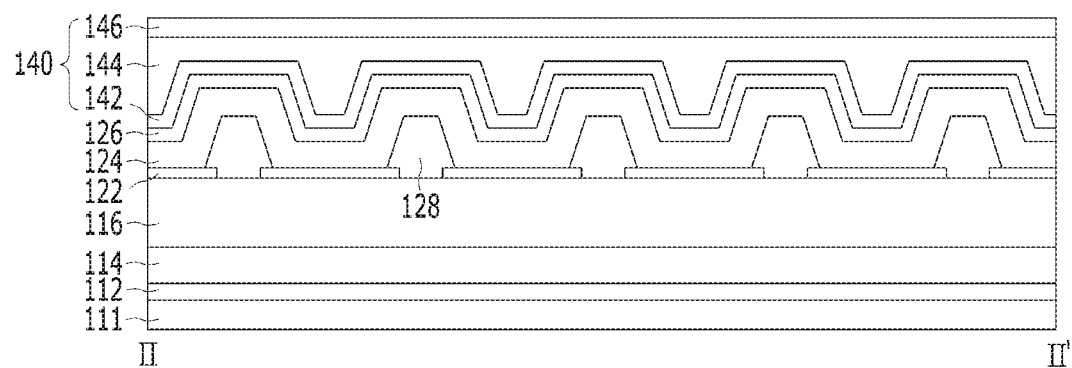
FIGS. 7A to 7E are cross-sectional views illustrating a method of manufacturing the organic light emitting display device shown in FIG. 5 according to an embodiment of the present invention.
Figure 7A:
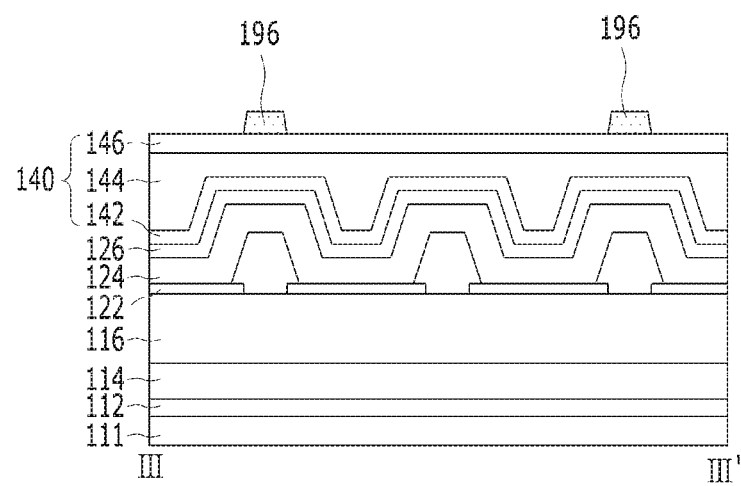
Figure 7B:
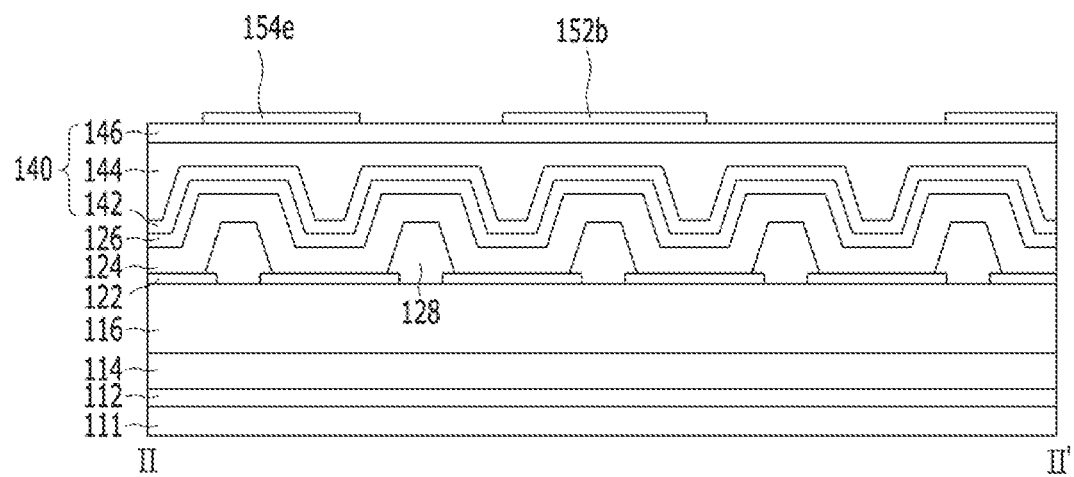
Figure 7B:
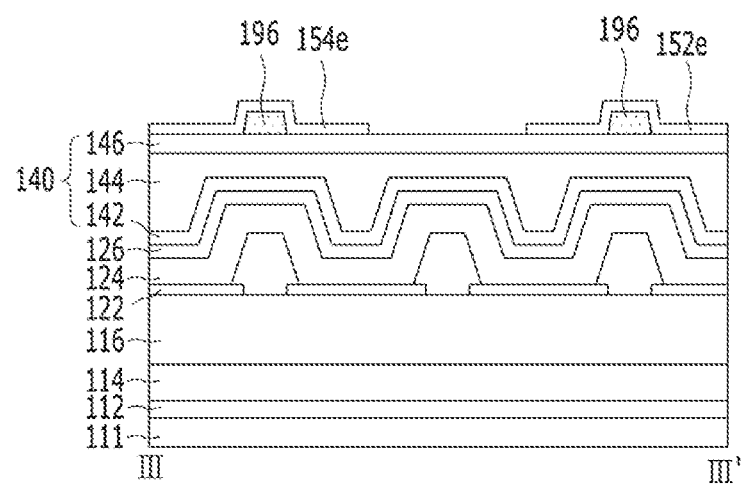
Figure 7C:
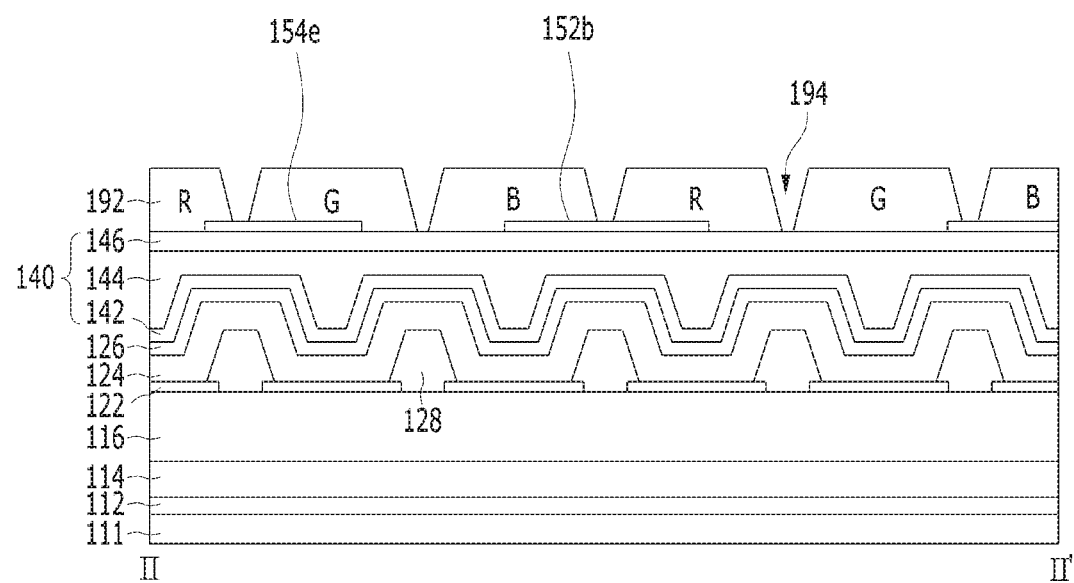
Figure 7C:
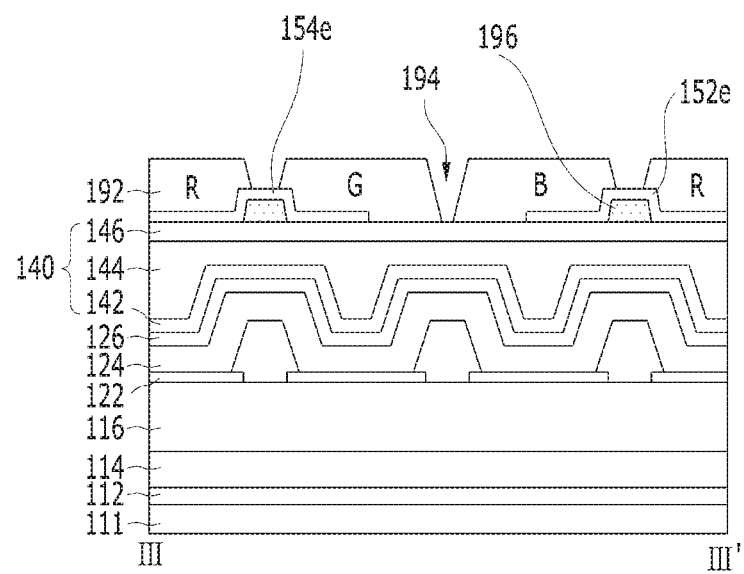

Thereafter, a red color resin is applied to the substrate 111 provided with the first and second touch electrodes 152*e* and 154*e*, the first bridges 152*b* and the second pad electrodes 163 formed thereon and is then patterned through a photolithography process, thus forming red (R) color filters 192, as exemplarily shown in FIG. 7C. Thereafter, a green color resin is applied to the substrate 111 provided with the red (R) color filters 192 formed thereon and is then patterned through a photolithography process, thus forming green (G) color filters 192. Thereafter, a blue color resin is applied to the substrate 111 provided with the red (R) and green (G) color filters 192 formed thereon and is then patterned through a photolithography process, thus forming blue (B) color filters 192.

Figure 7D:
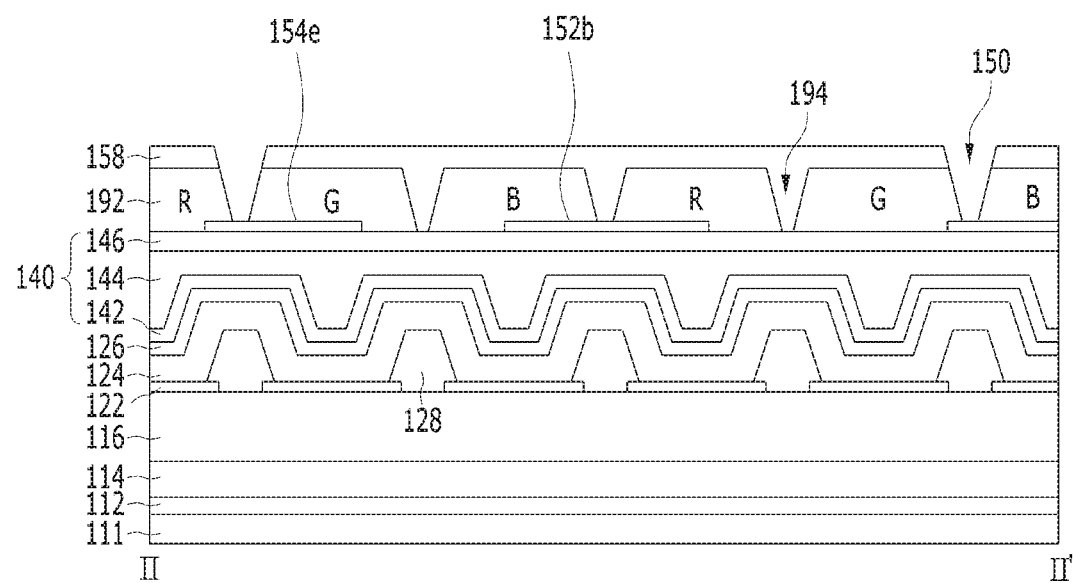
Figure 7D:
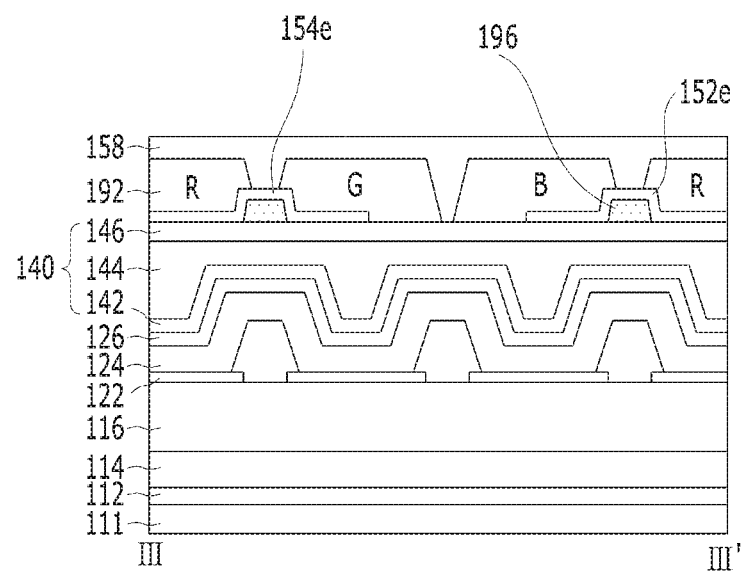
Figure 7E:
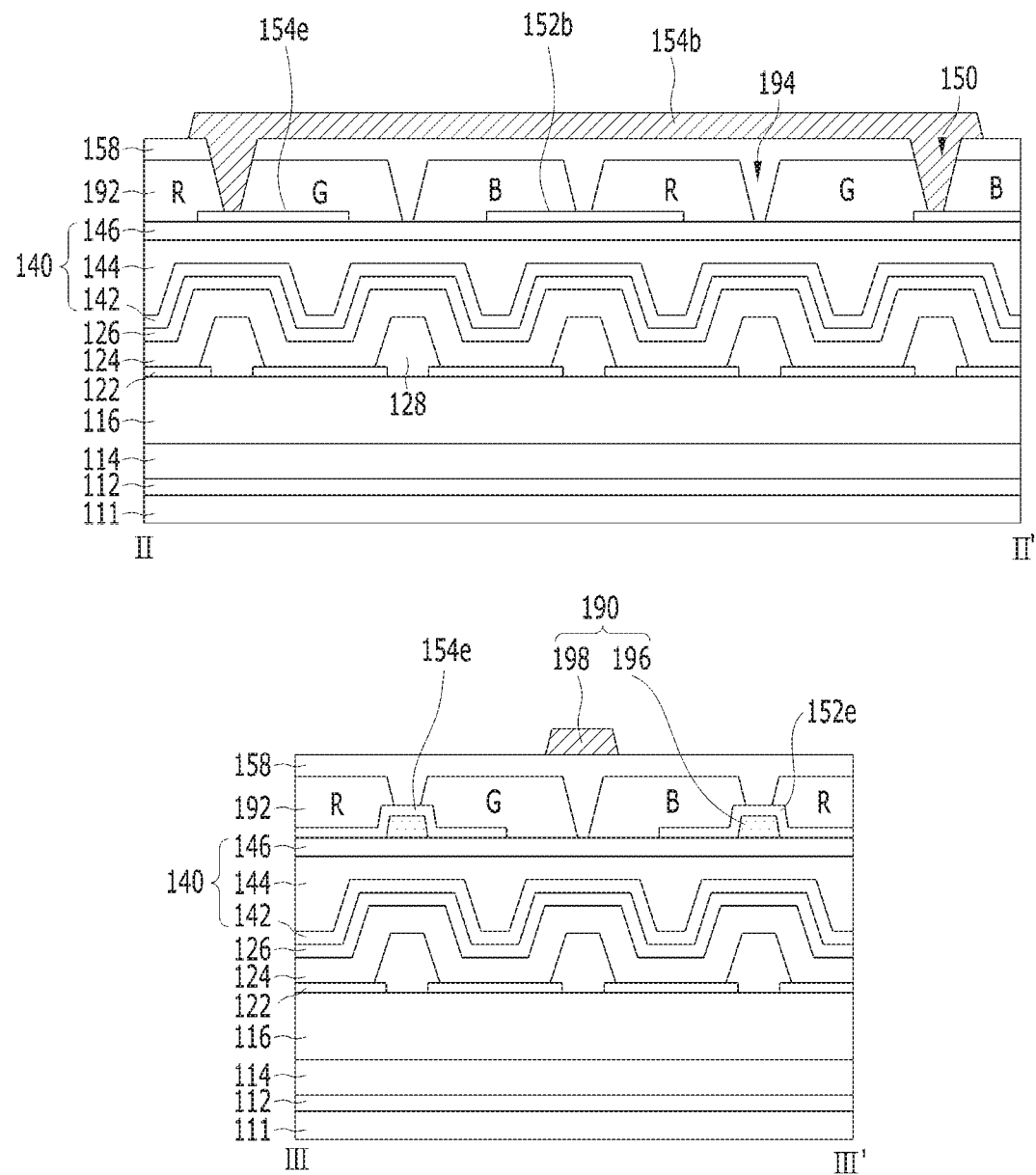

Thereafter, an inorganic or organic insulating material is deposited on the substrate 111 provided with the red (R), green (G) and blue (B) color filters 192 formed thereon, thus forming the touch insulating film 158, as exemplarily shown in FIG. 7D. Here, as the touch insulating film 158, an inorganic film, such as $SiN_x$, SiON or $SiO_x$, or an organic film, such as an acrylic-based organic film, an epoxy-based organic film, Parylene-C, Parylene-N, Parylene-F or a siloxane-based organic film, can be used. Thereafter, the touch insulating film 158 is patterned through a photolithography process and an etching process, thus forming the touch contact holes 150. The touch contact holes 150 correspond to the color holes 194 in regions where the second touch electrodes 154*e* and the second bridges 154*b* overlap each other.

Thereafter, an opaque conductive layer is deposited on the whole surface of the touch insulating film 158 having the touch contact holes 150. Thereafter, the opaque conductive layer is patterned through a photolithography process and an etching process, thus forming the second bridges 154*b* and the second black layer 198, as exemplarily shown in FIG. 7E.

As such, in the embodiments of the present invention, the first black layer 196 of the black matrix 190 is formed through the same mask process as the routing lines 160 and the second black layer 198 of the black matrix 190 is formed through the same mask process as the second bridges 154*b*. Thus, a separate mask process to form the black matrix 190 can be omitted and thus the manufacturing process of the display device can be simplified. Moreover, in contrast to a conventional touchscreen which is attached to a conventional organic light emitting display device through an adhesive, the touch electrodes 152*e* and 154*e* are arranged on the encapsulation unit 140 of the display device in accordance with the present invention without a separate attachment process and, thus, process simplification and manufacturing cost reduction can be achieved.

As apparent from the above description, in a display device having touch sensors in accordance with one or more embodiments of the present invention, a recessed portion is formed at at least one side surface of each of color filters and the recessed portions of the neighboring color filters implementing different colors contact each other, thus forming color holes between the neighboring color filters implementing different colors. Second bridges, connected to second touch electrodes through the color holes and touch contact holes, and a second black layer of a black matrix arranged on the color holes can have the same line width as the color holes at most. Therefore, the second black layer and the second bridges in accordance with the present invention can have a line width of at least 4 µm and, thus, an aperture ratio can be improved. Further, a first black layer of the black matrix is formed through the same mask process as routing lines and the second black layer of the black matrix is formed through the same mask process as the second bridges and, thus, a separate mask process to form the black matrix can be omitted and thus the manufacturing process of the display device can be simplified. Moreover, in contrast to a conventional touchscreen which is attached to a conventional organic light emitting display device through an adhesive, touch electrodes are arranged on an encapsulation unit of the display device in accordance with the present invention without a separate attachment process and, thus, process simplification and cost reduction can be achieved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A display device comprising:
a plurality of light emitting elements arranged on a substrate;
an encapsulation unit arranged on the light emitting elements;
a plurality of touch electrodes arranged on the encapsulation unit;
a plurality of routing lines disposed along a side surface of the encapsulation unit;
a plurality of color filters arranged on the touch electrodes;
a black matrix arranged between the color filters;
at least one insulating layer arranged between the substrate and the encapsulation unit; and
a plurality of touch pads connected to the routing lines, wherein the touch pads contact the at least one insulating layer, and
wherein the black matrix comprises:
a first black layer conductively connected to the touch electrodes and arranged between the color filters overlapping the touch electrodes; and a second black layer arranged on a different plane from the first black layer and arranged between the color filters not overlapping the touch electrodes.

2. The display device according to claim 1, further comprising:
a plurality of first bridges configured to connect a plurality of first touch electrodes arranged in a first direction, out of the touch electrodes; and
a plurality of second bridges configured to connect a plurality of second touch electrodes arranged in a second direction interconnecting the first direction, out of the touch electrodes,
wherein the second black layer is formed of the same material as the second bridges and is arranged on the same plane as the second bridges.

3. The display device according to claim 2, wherein the plurality of routing lines are connected to the first and second touch electrodes,
wherein the first black layer is formed of the same material as the routing lines and is arranged on the encapsulation unit.

4. The display device according to claim 2, wherein:
the first and second touch electrodes directly contact the first black layer; and
the first and second touch electrodes do not contact the second black layer.

5. The display device according to claim 2, wherein each of the color filters is formed to have one polygonal shape, selected from the group consisting of a hexagonal shape, a heptagonal shape and an octagonal shape.

6. The display device according to claim 2, wherein each of the color filters has a first side surface with a recessed portion and a second side surface without the recessed portion, and
wherein the second bridges and the second black layer arranged on the color filters overlap the first side surface of each of the color filters.

7. The display device according to claim 2, wherein each of the color filters has a first side surface with a recessed portion and a second side surface without the recessed portion,
wherein the first side surface of each of the color filters contacts the second side surface of the neighboring color filter, and
wherein color holes are formed between the neighboring color filters implementing different colors.

8. The display device according to claim 7, further comprising a touch insulating layer arranged between the color filters and the second bridges,
wherein the second bridges are conductively connected to the second touch electrodes exposed through touch contact holes, formed through the touch insulating layer, and the color holes.

9. The display device according to claim 2, wherein each of the color filters has a first side surface with a first recessed portion and a second side surface with a second recessed portion.

10. The display device according to claim 9, wherein the second bridges and the second black layer arranged on the color filters overlap the first and second side surfaces of each of the color filters.

11. The display device according to claim 9, wherein the first side surfaces of each of the color filters contacts the second side surface of the neighboring color filter, and
wherein color holes are formed between the neighboring color filters implementing different colors.

12. The display device according to claim 11, further comprising a touch insulating layer arranged between the color filters and the second bridges,
wherein the second bridges are conductively connected to the second touch electrodes exposed through touch contact holes, formed through the touch insulating layer, and the color holes.

13. The display device according to claim 1, wherein the first and second black layers are formed as a mesh type.

14. The display device according to claim 3,
wherein the routing lines contact side surfaces of the encapsulation unit, and the touch pads contact the at least one insulating layer.

15. The display device according to claim 14, further comprising:
a plurality of thin film transistors connected to the light emitting elements;
a buffer layer arranged between an active layer of the thin film transistors and the substrate;
an interlayer insulating layer arranged between gate electrodes and source and drain electrodes of the thin film transistors; and
a protective layer arranged between the source and drain electrodes and the light emitting elements,
wherein the at least one insulating layer includes at least one of the buffer layer, the interlayer insulating layer or the protective layer.

16. The display device according to claim 1, wherein the second black layer is arranged between the touch electrodes not to overlap the touch electrodes.

17. A display device comprising:
a plurality of light emitting elements arranged on a substrate;
an encapsulation unit arranged on the light emitting elements;
a plurality of touch electrodes arranged on the encapsulation unit;
a plurality of color filters arranged on the touch electrodes;
a black matrix arranged between the color filters;
a plurality of first bridges configured to connect a plurality of first touch electrodes arranged in a first direction, out of the touch electrodes; and
a plurality of second bridges configured to connect a plurality of second touch electrodes arranged in a second direction interconnecting the first direction, out of the touch electrodes,
wherein the black matrix comprises:
a first black layer conductively connected to the touch electrodes and arranged between the color filters overlapping the touch electrodes; and
a second black layer arranged on a different plane from the first black layer and arranged between the color filters not overlapping the touch electrodes, and
wherein the second black layer is formed of the same material as the second bridges and is arranged on the same plane as the second bridges.

\* \* \* \* \*